(12) United States Patent
Nakai

(10) Patent No.: US 6,784,933 B1
(45) Date of Patent: Aug. 31, 2004

(54) SOLID-STATE IMAGING DEVICE AND METHOD FOR CONTROLLING SAME

(75) Inventor: Hiroto Nakai, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 915 days.

(21) Appl. No.: 09/653,190

(22) Filed: Aug. 31, 2000

(30) Foreign Application Priority Data

Sep. 10, 1999 (JP) .............................. 11-258054

(51) Int. Cl.[7] ....................... H04N 5/335; H01L 31/062; H01L 21/00; G11C 17/00
(52) U.S. Cl. ....................... 348/302; 348/308; 348/307; 257/291; 438/57; 365/104
(58) Field of Search ................................ 348/303, 307, 348/308, 311, 313, 294, 302; 257/290, 234, 291, 292; 438/57, 73; 365/104

(56) References Cited

U.S. PATENT DOCUMENTS

| | | | |
|---|---|---|---|
| 4,489,400 A | * 12/1984 | Southerland, Jr. ........... | 365/104 |
| 4,893,273 A | 1/1990 | Usami | |
| 4,959,812 A | * 9/1990 | Momodomi et al. ..... | 365/185.17 |
| 5,471,515 A | * 11/1995 | Fossum et al. ................ | 377/60 |
| 5,587,948 A | * 12/1996 | Nakai ..................... | 365/185.17 |
| 5,717,458 A | * 2/1998 | Yonemoto ................... | 348/305 |
| 5,835,141 A | * 11/1998 | Ackland et al. ............ | 348/308 |
| 5,850,091 A | * 12/1998 | Li et al. ...................... | 257/316 |
| 6,118,696 A | * 9/2000 | Choi ...................... | 365/185.11 |
| 6,285,587 B1 | * 9/2001 | Kwon .................... | 365/185.11 |
| 6,326,230 B1 | * 12/2001 | Pain et al. ..................... | 438/57 |
| 6,492,694 B2 | * 12/2002 | Noble et al. ................ | 257/410 |
| 6,563,540 B2 | * 5/2003 | Trevino et al. ............. | 348/302 |

FOREIGN PATENT DOCUMENTS

| | | |
|---|---|---|
| JP | 61-222262 | 1/1990 |
| JP | 2-237077 | 9/1990 |
| JP | 8-340100 | 12/1996 |

* cited by examiner

Primary Examiner—Wendy R. Garber
Assistant Examiner—Lin Ye
(74) Attorney, Agent, or Firm—Banner & Witcoff, Ltd.

(57) ABSTRACT

A pixel unit 1 comprises a nonvolatile memory transistor MT, which is formed on a p-type well 12 of a semiconductor substrate 10 and which has a floating gate 14 and a control gate 16, and selecting gate transistors ST1 and ST2 which share a diffusion layer 17 with the memory transistor MT and which is formed on both sides of the memory transistor MT. The memory transistor MT has a photoelectric converting region PD in the substrate directly below the floating gate 14. By irradiating the memory transistor MT with light while a positive writing voltage is applied to the control gate 16, charges generated in the photoelectric converting region PD are injected into the floating gate 14 to be held therein, so that pixel information is stored as a threshold voltage. Thus, it is possible to provide a solid-state imaging device with memory function, which has a small unit pixel area, a small electric current consumption and a simple structure and which can be produced without the need of any complicated producing processes.

15 Claims, 9 Drawing Sheets

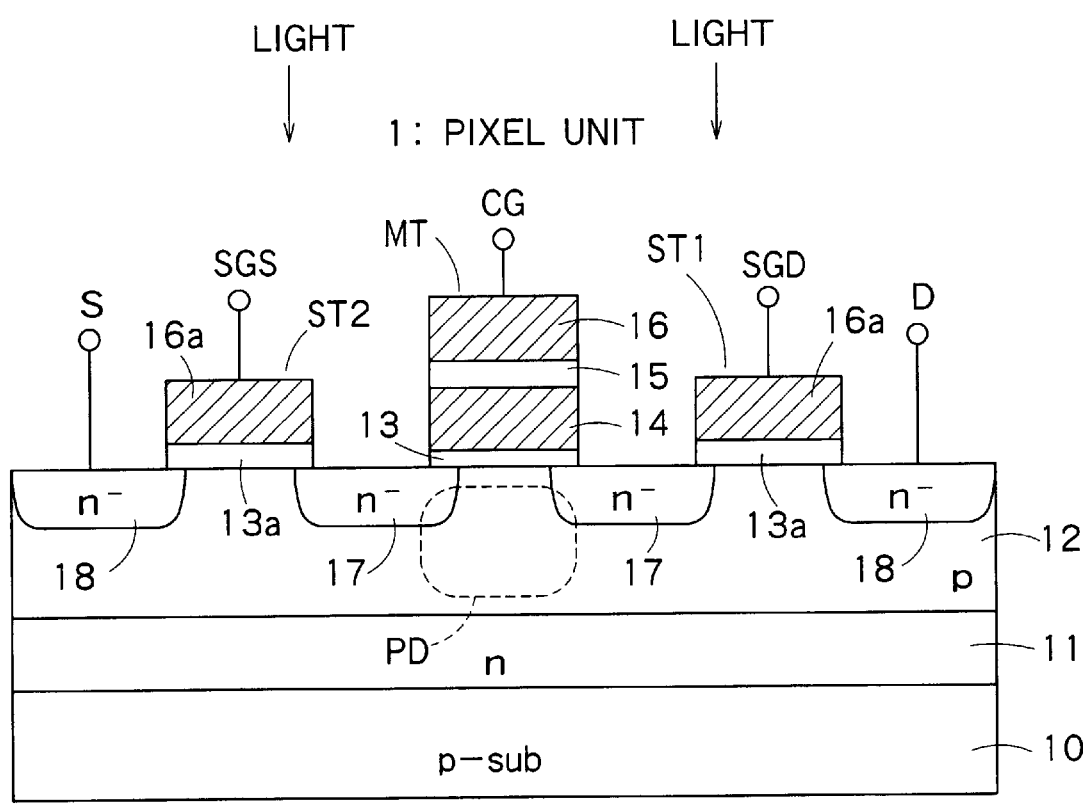
F I G. 1

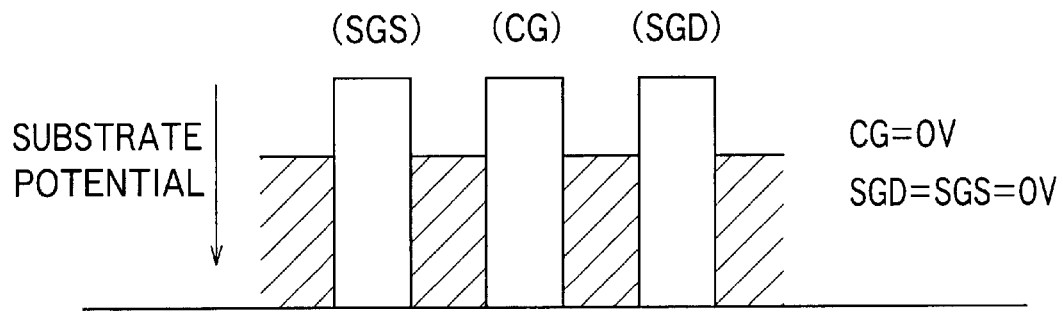
F I G. 2A
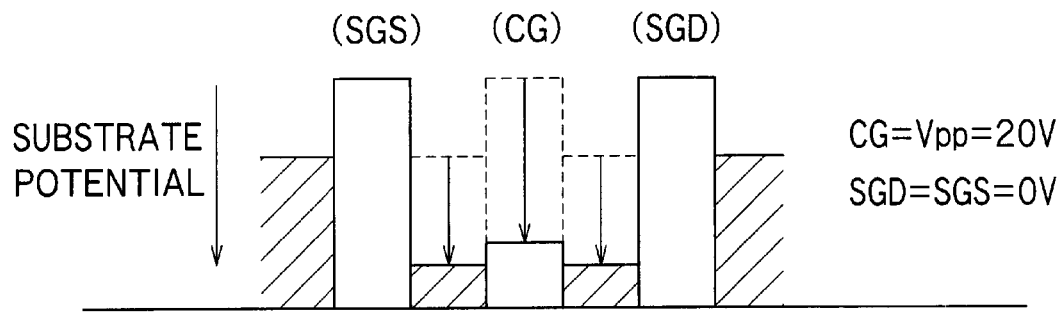
F I G. 2B
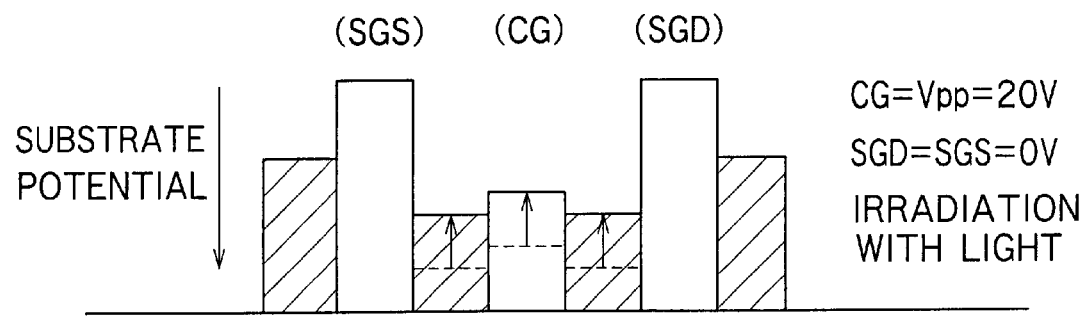
F I G. 2C

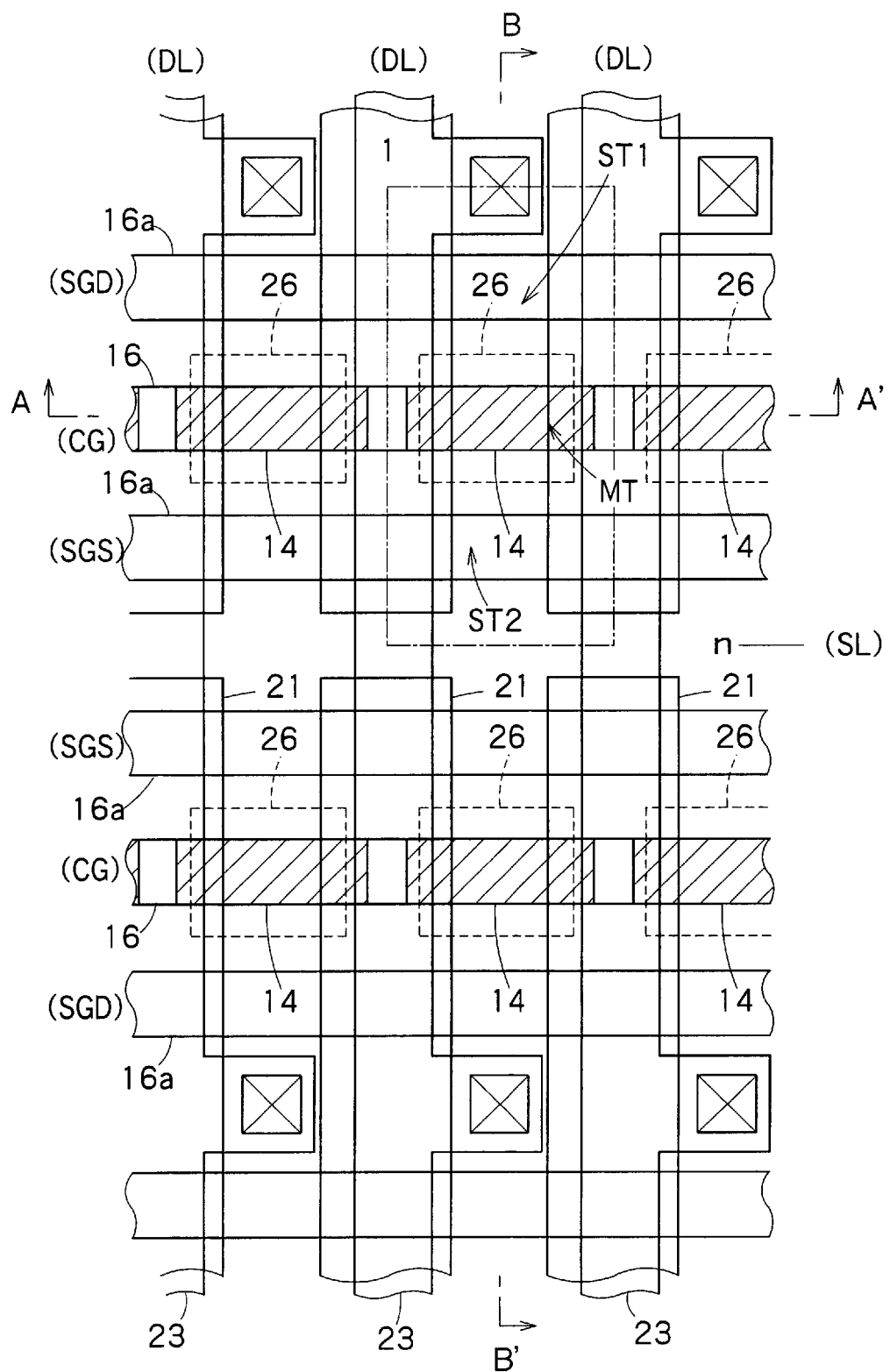
F I G. 5

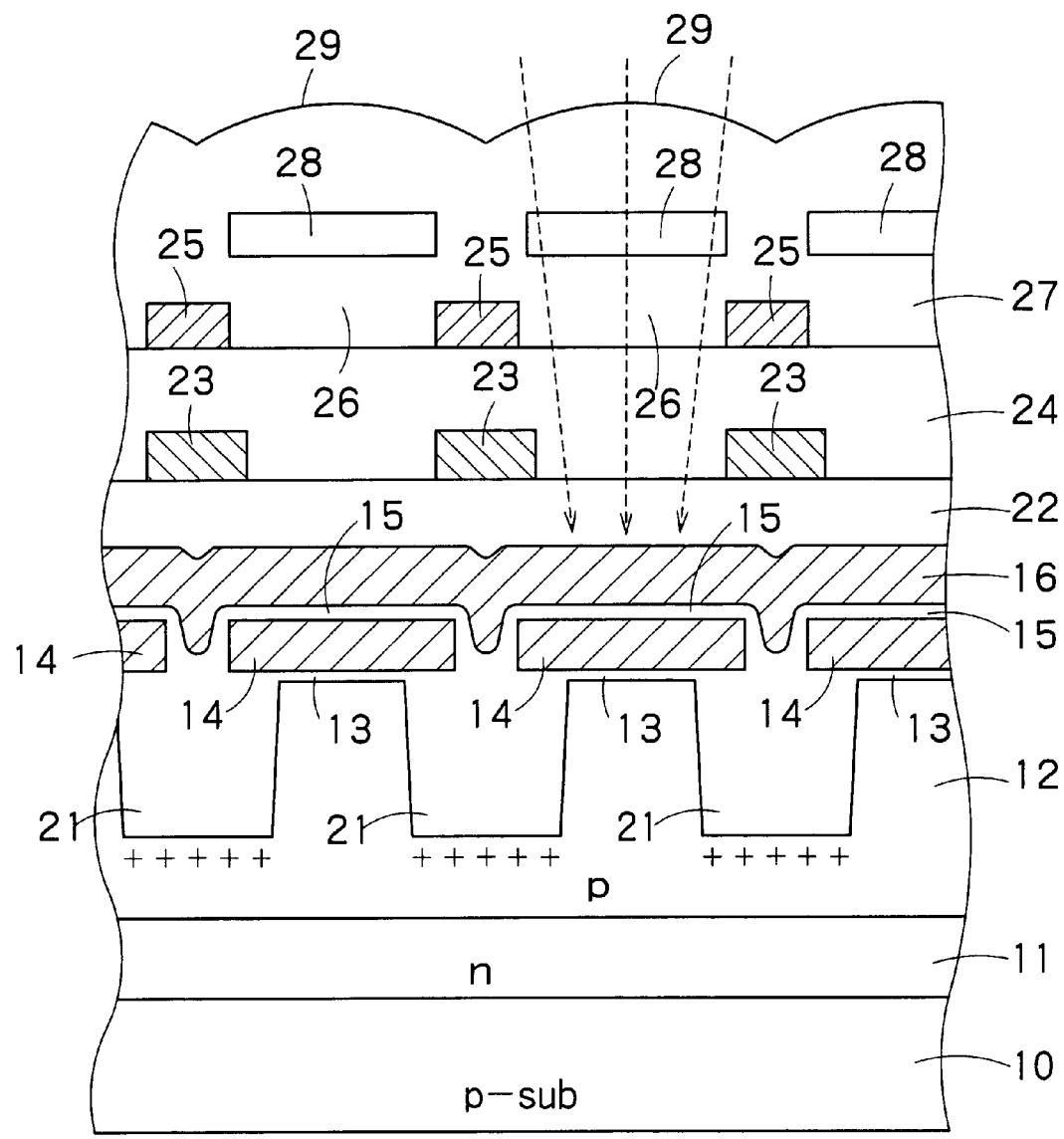
F I G. 6

SOLID-STATE IMAGING DEVICE AND METHOD FOR CONTROLLING SAME

RELATED APPLICATION

This application claims the benefit of priority under 35 U.S.C. § 119 of Japanese Patent Application No. H11-258054, filed on Sep. 10, 1999, the entire contents of which are incorporated by reference herein.

BACKGROUND OF THE INVENTION

1. Field of the Invention

The present invention relates generally to a solid-state imaging device. More specifically, the invention relates to a solid-state imaging device having the memory function of nonvolatile-storing picked-up image information.

2. Description of the Related Background Art

As solid-state imaging device, CCD imaging devices and MOS type imaging devices are known. In the CCD imaging devices, pixel information photoelectric-converted by a light receiving part, such as a photo diode, is transferred in a charge signal state by means of a CCD and read out. In the MOS type imaging devices, pixel information photoelectric-converted by a light receiving part is read out directly to an output line by means of a MOS transistor.

There have been proposed the following examples of these solid-state imaging devices having the memory function of nonvolatile-storing picked-up pixel information:

(1) A structure wherein a nonvolatile memory transistor is provided between a light receiving part and vertical CCD transfer part of a CCD imaging device (Japanese Patent Laid-Open No. H8-340100);
(2) A structure wherein a resistive element connected to a drain of a nonvolatile memory transistor is formed of a photoconductive material to vary a drain applied voltage in accordance with the quantity of light to inject charges corresponding to the quantity of light into a floating gate (Japanese Patent Laid-Open No. H2-237077); and
(3) A structure wherein a control gate of an ultraviolet erasing nonvolatile memory transistor is provided with a light passage to control the quantity of charges, which are injected into a floating gate, in accordance with the quantity of light, with which a channel region is irradiated via the light passage (Japanese Patent Publication No. H1-26193).

In the structure (1), since the nonvolatile memory transistor is arranged between the receiving part and CCD transfer part of a usual frame transfer or inter line transfer type CCD imaging devices, the unit pixel area is large, and the chip area of an image pickup element is also large.

In the structure (2), since the resistive element of a photoconductive film is used, the unit pixel area is large, and it is required to carry out a special process which is not included in a process for producing a usual imaging device or a nonvolatile memory, so that the producing process is complicated.

The structure (3) is a special structure wherein the control gate is provided with the light passage, so that it is not easily produced. In addition, since this structure utilizes the hot electron injection in the writing system, it is difficult to actually control the hot electron injection by the amount of light from the light passage which is formed in the control gate, so that this structure is not put to practical use.

SUMMARY OF THE INVENTION

It is therefore an object of the present invention to eliminate the aforementioned problems and to provide a solid state-imaging device with memory function, which has a small unit pixel area, a small electric current consumption and a simple structure and which can be produced without the need of any complicated producing processes, and a method for controlling the same.

In order to accomplish the aforementioned and other objects, according to one aspect of the present invention, a solid-state imaging device comprising:
a semiconductor substrate;
a nonvolatile memory transistor which is formed on the semiconductor substrate and which has a charge storage layer and a control gate, a photoelectric converting region being arranged below the charge storage layers and in the semiconductor substrate, the nonvolatile memory transistor being irradiated with light to generate charges in the photoelectric converting region and to inject the charges into the charge storage layer, the charges being stored in the charge storage layer as pixel information; and
at least two selecting gate transistors, each of which is formed on both sides of the nonvolatile memory transistor so as to share a diffusion layer with the nonvolatile memory transistor.

According to the present invention, unlike conventional structures wherein a nonvolatile memory transistor is provided separately from a light receiving part, a substrate region below a charge storage layer of a nonvolatile memory transistor is used as a photoelectric converting region, so that an image pickup pixel unit with memory function can be formed in a small area. During image pickup, selecting gate transistors arranged on both sides of the nonvolatile memory remain being turned off to form a potential barrier to the photoelectric converting region to allow an efficient photoelectric conversion.

In addition, the selecting gate transistors function as switching elements when pixel information held in the nonvolatile memory transistor in a threshold state is read out. Therefore, since no CCD is used for reading pixel information, the electric current consumption is smaller than those in the conventional imaging device using the CCD.

Moreover, the pixel unit according to the present invention has the same structure as that of an EEPROM memory so that it can be realized by a simple producing process in no need of any particularly complicated structures.

According to another aspect of the present invention, a method for controlling a solid-state imaging device comprising:
a semiconductor substrate;
a nonvolatile memory transistor which is formed on the semiconductor substrate and which has a charge storage layer and a control gate, a photoelectric converting region being arranged below the charge storage layers and in the semiconductor substrate, the nonvolatile memory transistor being irradiated with light to generate charges in the photoelectric converting region and to inject the charges into the charge storage layer, the charges being stored in the charge storage layer as pixel information; and
at least two selecting gate transistors, each of which is formed on both sides of the nonvolatile memory transistor so as to share a diffusion layer with the nonvolatile memory transistor,
wherein a plurality of pixel units are arranged on the semiconductor substrate in the form of a matrix so as to extend in row and column directions, each of the pixel units comprising the nonvolatile memory transistor and two the selecting gate transistors arranged on both sides thereof, the method comprising:

an erase step for electrically emitting charges from the charge storage layer of the nonvolatile memory transistors;

an image pickup step for turning off the selecting gate transistors and irradiating the nonvolatile memory transistors with light while a writing voltage is applied to the control gate of the nonvolatile memory transistors, to inject charges generated in the photoelectric converting region of a corresponding one of the nonvolatile memory transistors, into the charge storage layer of the corresponding one of the nonvolatile memory transistors; and a reading step for reading the pixel information by applying a reading voltage to the control gate of a corresponding one of the nonvolatile memory transistors while the selecting gate transistors are turned on.

According to further aspect of the present invention, a method for controlling a solid-state imaging device comprising:

a semiconductor substrate;

a nonvolatile memory transistor which is formed on the semiconductor substrate and which has a charge storage layer and a control gate, a photoelectric converting region being arranged below the charge storage layers and in the semiconductor substrate, the nonvolatile memory transistor being irradiated with light to generate charges in the photoelectric converting region and to inject the charges into the charge storage layer, the charges being stored in the charge storage layer as pixel information: and at least two selecting gate transistors, each of which is formed on both sides of the nonvolatile memory transistor so as to share a diffusion layer with the nonvolatile memory transistor, wherein a plurality of pixel units are arranged on the semiconductor substrate in the form of a matrix so as to extend in row and column directions, each of the pixel units comprising the nonvolatile memory transistor and two the selecting gate transistors arranged on both sides thereof, the method comprising:

an erase step for electrically emitting charges from the charge storage layer of the nonvolatile memory transistors;

a pre-writing step for turning off the selecting gate transistors and applying a first writing voltage to the control gates of the nonvolatile memory transistors, to inject charges, which exist in an inversion layer formed in a channel region of a corresponding one of the nonvolatile memory transistors, into the charge storage layer of the corresponding one of the nonvolatile memory transistors, the charges being stored in each of the charge storage layers as dummy pixel information; and a pre-reading step for reading and storing the dummy pixel information by applying a reading voltage to the control gate of each of the nonvolatile memory transistors while each of the selecting gate transistors are turned on;

a pre-charging step for pre-charging a channel region of each of the nonvolatile memory transistors on the basis of the dummy pixel information;

an image pickup step for turning off the selecting gate transistors and irradiating the nonvolatile memory transistors with light while a second writing voltage is applied to the control gate of the nonvolatile memory transistors, to inject charges generated in the photoelectric converting region of a corresponding one of the nonvolatile memory transistors, into the charge storage layer of the corresponding one of the nonvolatile memory transistors, the charges being stored in the charge storage layer as the pixel information; and a reading step for reading the pixel information by applying a reading voltage to the control gate of a corresponding one of the nonvolatile memory transistors while each of the selecting gate transistors are turned on.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 1 is a sectional view of a preferred embodiment of a pixel unit according to the present invention;

FIGS. 2A through 2C are illustrations for explaining the image pickup principle of the pixel unit in the preferred embodiment;

FIG. 5 is a layout drawing showing an example wherein the preferred embodiment is applied to a two-dimensional image sensor;

FIG. 6 is a sectional view taken along line A–A' of FIG. 5;

DESCRIPTION OF THE PREFERRED EMBODIMENTS

Figure 3A:
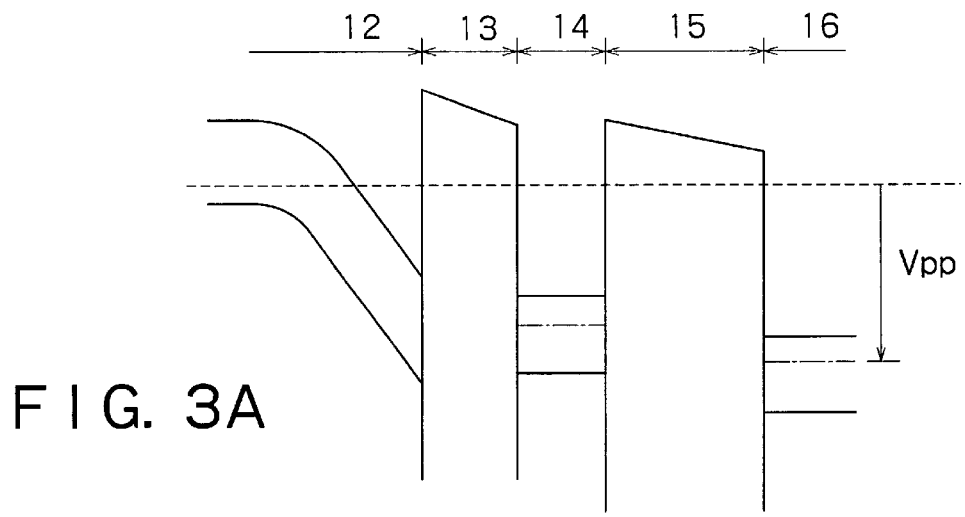
FIGS. 3A and 3B are illustrations for explaining the image pickup principle of the pixel unit using the potential relations in a memory transistor part.

Referring now to the accompanying drawings, the preferred embodiments of the present invention will be described below.

FIG. 1 shows the construction of one pixel unit 1 of a preferred embodiment of a solid-state imaging device according to the present invention. The pixel unit 1 comprises a nonvolatile memory transistor (which will be hereinafter simply referred to as a memory transistor) MT, and two selecting gate transistors ST1 and ST2 which are arranged on both sides thereof. The memory transistor MT and the selecting gate transistors STI and ST2 are formed on a p-type well 12 in an n⁻-type well 11 formed on a p-type silicon substrate 10.

The memory transistor MT is a stacked gate type NMOS transistor having a floating gate 14, which is formed on the p-type well 12 via a tunnel insulating film 13 having a thickness of about 10 nm and which serves as a charge storage layer, and a control gate 16 which is formed thereon via an interlayer dielectric film. In this preferred embodiment, for example, both of the floating gate 14 and the control gate 16 are formed of a polycrystalline silicon or a metal silicide. By self-aligned the control gate 16, n⁻-type diffusion layers 17 is formed serving as source and drain diffusion layers. The control gate 16 of the memory transistor MT is connected to a control gate line CG, which is a driving line for controlling image pickup, storage and readout.

Each of the selecting gate transistors ST1 and ST2 is an NMOS transistor which shares one of the diffusion layers 17 with the main transistor MT. The gate insulating film 13a of each of the selecting gate transistors ST1 and ST2 is thicker than the tunnel insulating film 13 of the memory transistor MT. Gate electrodes 16a are formed simultaneously with the control gate 16 of the memory transistor MT. Although the gate electrode 16a is shown as only one layer in the figure, a gate of two layers is short-circuited to be used as the same stacked gate structure as the memory transistor MT in an actual producing process. The n⁻-type diffusion layer 18 of one selecting gate transistor STI opposite to the memory transistor MT serves as a drain terminal D, which is connected to a signal output line when the pixel units 1 are arranged in the form of a matrix. The n⁻-typed diffusion layer 18 of the other selecting gate transistor ST2 opposite to the memory transistor MT serves as a source terminal D, which is connected to a common source line when the pixel units 1 are arranged in the form of a matrix. The gate terminals of the selecting gate transistors ST1 and ST2 are connected to selecting gate lines SGD and SGS, respectively.

In this preferred embodiment, the memory transistor MT is designed to nonvolatile-store picked-up pixel information, in a threshold state, and a region surrounded by a broken line in the p-type well 12 below the floating gate 14 serves as a photoelectric converting region PD. That is, light from the top of the memory transistor MT enters the photoelectric converting region PD. Electrons generated in the photoelectric converting region PD are injected into the floating gate 14 of the memory transistor MT by the FN tunneling.

Furthermore, in FIG. 1, all of the source and drain diffusion layers 17 and 18 in the pixel unit 1 are n⁻type layers. Among these layers 17 and 18, the source and drain diffusion layers 17 of the memory transistor MT must be n⁻type layers. The source and drain diffusion layers 18 of the selecting gate transistors ST1 and ST2 opposite to the memory transistor MT may be high-density n⁺-type layers.

FIGS. 2A through 2C show the relations between substrate potentials for explaining the principle of image pickup operation of the pixel unit 1 in this preferred embodiment.

FIG. 2A shows a state that no bias is applied to the pixel unit 1. In the pixel unit 1 according to this preferred embodiment, during image pickup, the selecting gate transistors ST1 and ST2 are held in an off state (SGD=SGS=0 V), the p-type well 12 is set at a voltage of 0 V, and a writing voltage Vpp (e.g., 20 V), which is a positive high voltage, is first applied to the control gate 16 of the memory transistor MT. Thus, as shown in FIG. 2B, it raises that the substrate potential of the photoelectric converting region PD below the memory transistor MT.

Then, while this bias state is held, the region of the memory transistor MT is irradiated with light. Thus, when electrons are generated in the photoelectric converting region PD, the substrate potential of that portion falls as shown in FIG. 2C. By this fall of substrate potential, a great electric field is applied to the tunnel insulating film 13 of the memory transistor MT, and the electrons collected in the channel region are injected into the floating gate 14 by the FN tunneling. This is the principle of image pickup operation in the pixel unit 1. The quantity of electrons generated in the substrate increases in accordance with the quantity of light, and in accordance with this, the quantity of electrons injected into the floating gate 14 also increases. That is, pixel information is nonvolatile-stored in the memory transistor MT simultaneously with image pickup, as a threshold voltage which varies in accordance with the quantity of light.

The above described operations of image pickup and storage will be described in more detail. When the writing voltage Vpp is applied to the control gate 16 as described above, the potential VFG of the floating gate 15 is determined by the capacity ratio of a capacity C1 between the control gate 16 and the floating gate 15, and a capacity C2 between the floating gate 14 and the substrate, so that VFG=Vpp·C1/(C1+C2). If C1/(C1+C2) =about 0.6, the potential of the floating gate 14 is VFG=12V +α, wherein α is a threshold shift in an erase state (a state that no electrons are injected into the floating gate 14) from the floating gate, and is about 2 to 3 V. Therefore, the potential of the floating gate 14 is about 14 V.

On the other hand, the surface potential of the p-type well 12 at this time increases as the density of impurities in the surface decreases and as the thickness of the tunnel insulating film 13 decreases. Assuming that the thickness of the tunnel insulating film 13 is 10 nm and that the surface density of the p-type well 12 is about 1E16/cm³, the surface potential of the p-type well 12 is about 13.5 V which is close to the potential of the floating gate 14.

FIG. 3A is a band diagram showing the relationship between potentials from the control gate 16 to p-type well 12 of the memory transistor MT in this state. By the above described capacitive coupling, the surface potential of the p-type well 12 rises while the electric field applied to the tunnel insulating film 13 is small, so that the surface of the p-type well 12 is in a depleted state. However, this state does not last much longer. If this state is held for several seconds or minutes, electrons serving as minority carriers are excited to be stored in the surface of the p-type well 12, so that the surface potential is lowered.

Figure 3B:
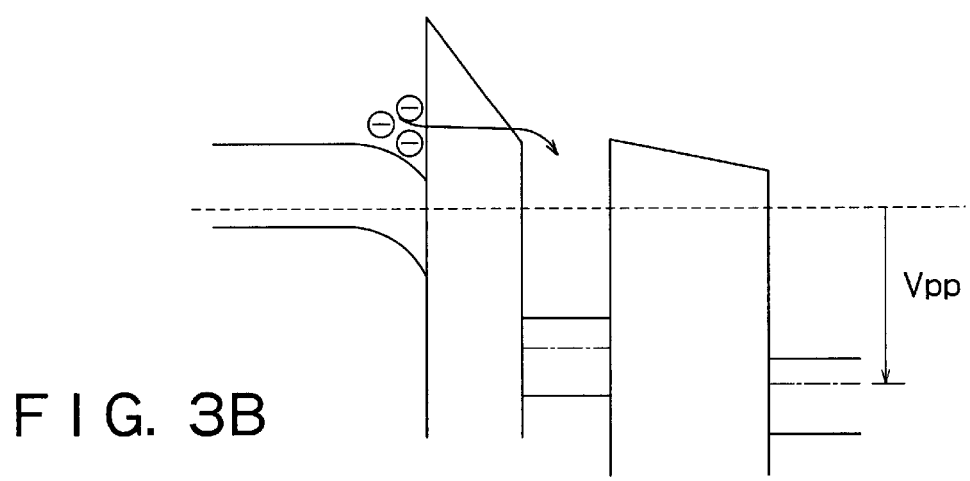

In this preferred embodiment, the region of the memory transistor MT is irradiated with light in such a state that carriers are not excited thermally in the p-type well and that the write voltage Vpp is applied to the control gate. Thus, electrons are excited in the p-type well 12, and the surface potential thereof falls. This fall of surface potential increases in accordance with the amount of light. By this fall of surface potential of the p-type well 12, the potential between the floating gate 14 and p-type well 12 increases as shown in FIG. 3B. For example, if the surface potential falls to about 0.7 V, a voltage of about 13.3V is applied to the tunnel insulating film 13. Thus, the electrons of the surface inversion layer of the p-type well 12 are injected into the floating gate 14 by the FN tunneling. Since a tunnel current flows so as to be exponentially in proportion to the electric field, the small variation in surface potential can be exponentially amplified.

Figure 4:
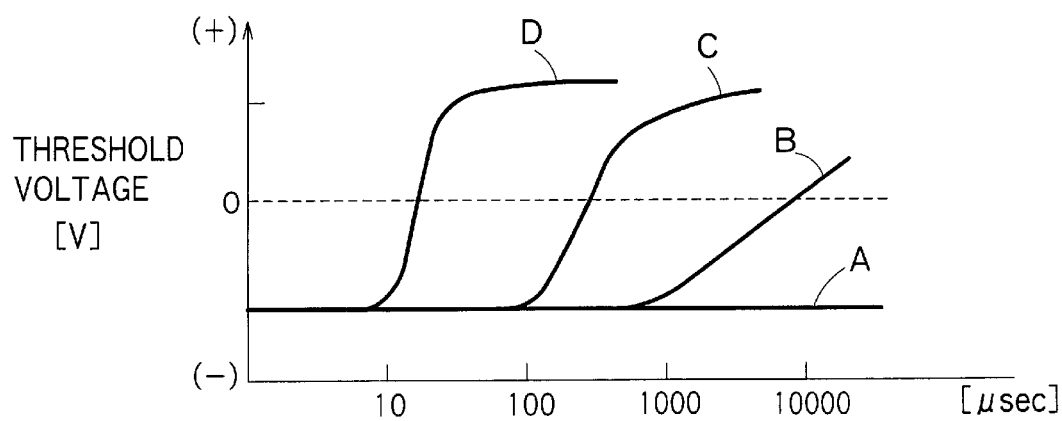
FIG. 4 is a graph showing the writing characteristic of the pixel unit.

FIG. 4 shows a writing characteristic of the pixel unit 1 in this preferred embodiment, i.e., a variation in threshold of the memory transistor MT versus writing time graph when the memory transistor MT is irradiated with a certain quantity of light. In FIG. 4, "A" shows a case where the memory transistor MT is not irradiated with light. In this case, the threshold does not vary before the elapse of 100 msec. In FIG. 4, "B" shows a case where the memory transistor MT is irradiated with weak light. In this case, the threshold starts to rise after the elapse of 1 msec , and rises linearly until the surface potential has the minimum value. In FIG. 4, "C" shows a case where the memory transistor MT is irradiated with stronger light. This shows a variation in threshold when the threshold starts to rise after the elapse of 100 $\mu$s and when the surface potential falls to about 0.7 V at 1 msec. When the surface potential falls to about 0.7 V, the rising speed of the threshold decreases, so that the gradient of the rising curve is gentle. In FIG. 4, "D" shows a case where the memory transistor MT is irradiated with very strong light. In this case, the surface potential instantaneously falls to 0.7 V. Therefore, the threshold suddenly rises, and thereafter, the threshold rises at a gentle gradient.

As described above, in this preferred embodiment, a nonvolatile image pickup element is realized by utilizing the fact that the falling speed of the surface potential varies in accordance with the intensity of light and by controlling the threshold voltage of the memory transistor in proportion to the intensity of light. For example, if the writing voltage Vpp is returned to 0 V when 1 msec elapses after the writing voltage Vpp is applied to the control gate 16, the threshold of the memory transistor MT irradiated with strong light has a low value, and the threshold of the memory transistor MT irradiated with weak light has a high value. This storage information is held even after the power supply of the device is turned off. Specifically, for example, the writing voltage Vpp and the application time of the wiring voltage Vpp are adjusted so that the threshold of the memory transistor is in the range of from –1 V to 3 V after the writing operation.

There are two methods for reading stored the pixel information. One method is a method for applying a positive voltage to the gates of the two selecting gate transistors STI and ST2 and the memory transistor to monitor a current flowing through the memory transistor MT. The other method is a source follower type reading method for supplying a predetermined voltage from the source to monitor a voltage appearing in the drain. In either case, the reading voltage applied to the control gate 16 of the memory transistor MT must be set so as not to be lower than the maximum threshold voltage of the memory transistor MT. For example, when the threshold voltage of the memory transistor MT is set to be in the range of from –1 V to 3 V as described above, the reading voltage applied to the control gate 16 is set to be 3 V. At this time, the current flowing through the memory transistor MT is in proportion to its threshold voltage. In the case of the source follower type, if a voltage of 3 V is supplied to the control gate 16 and if a voltage of 4 V is supplied to the common source, a voltage of 3 V—Vth (Vth: the threshold voltage of the memory transistor MT) appears in the drain portion. The latter source follower type can more precisely read the pixel information of the memory transistor MT.

Since the picked-up pixel information is nonvolatile-stored, it is required to erase the pixel information for the next image pickup operation. This erase operation is electrically carried out. In the erase operation, the voltage of the control gate 16 is set to be 0 V, and a positive erase voltage, which is substantially equal to the writing voltage, is applied to the p-type well 12 and the n-type well 11. At this time, the selecting gate transistors ST1 and ST2 are held to be turned off. Thus, the electrons of the floating gate 14 of the memory transistor MT are emitted to the substrate to erase the pixel information.

Figure 7:
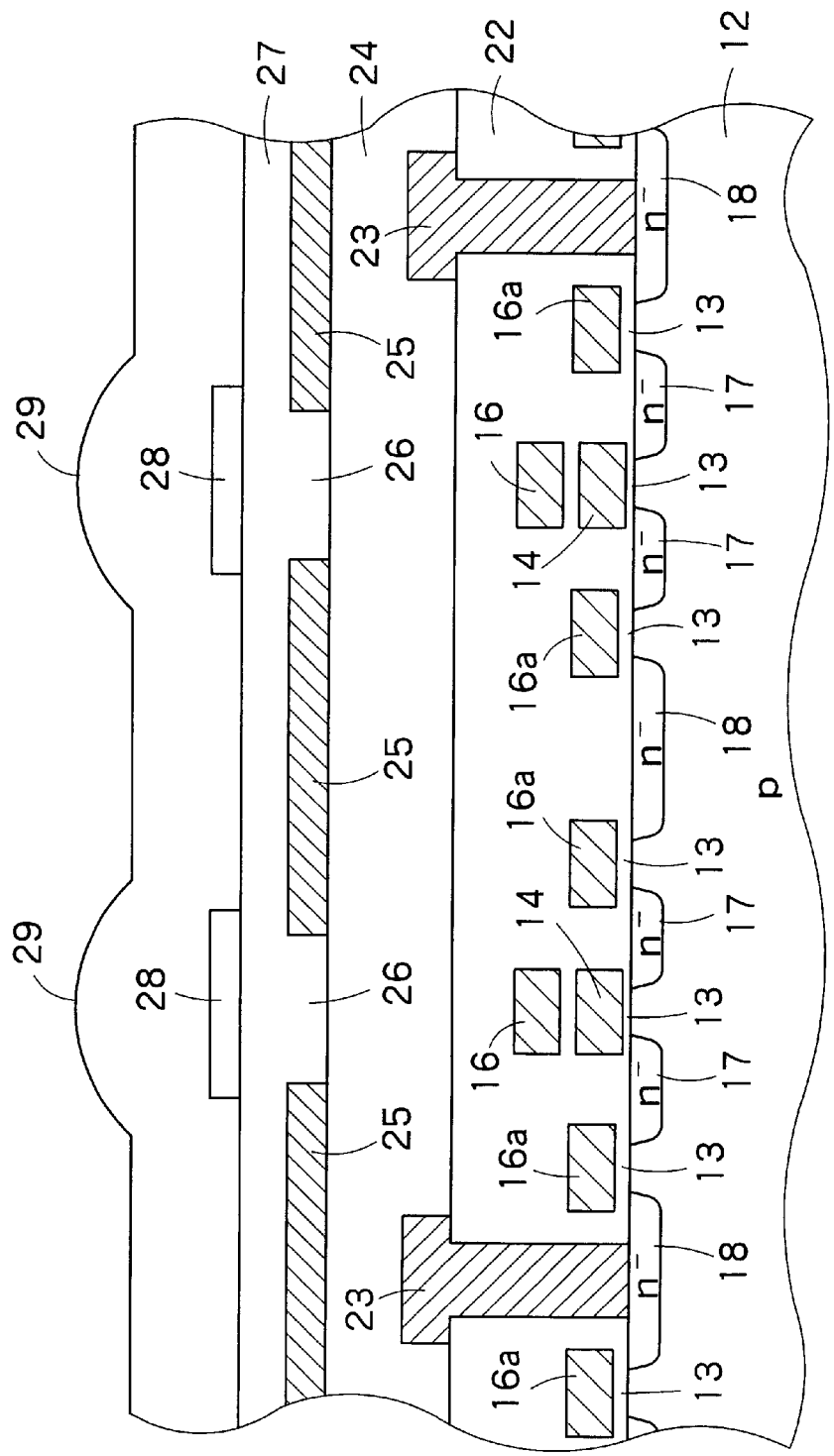
FIG. 7 is a sectional view taken along line B–B' of FIG. 5.

When a two-dimensional image sensor is formed, a plurality of pixel units 1 are arranged on the substrate in the form of a matrix. An example of a layout of such a pixel array is shown in FIG. 5. FIGS. 6 and 7 are sectional views taken along lines A–A' and B–B' of FIG. 5, respectively.

The p-type well 12 of the silicon substrate 10 is formed commonly for the pixel array. As shown in the figure, the p-type well 12 is formed with element isolating insulator films 21 for separating element forming regions. The element isolating insulator films 21 are formed by, e.g., the shallow trench isolation (STI) technique for forming a groove in a substrate to embed a silicon oxide film or the like therein.

On such an element-isolated substrate, the pixel units 1, each of which comprises the memory transistor MT and the two selecting gate transistors ST1 and ST2, are arranged in the form of a matrix. In FIG. 5, the range of one pixel unit 1 is indicated by the chain line. The control gates 16 of the memory transistors MT of the pixel units 1 extending in row directions are continuously patterned to serve as a control gate line CG. Similarly, the gate electrodes 16a of the selecting gate transistors ST1 and ST2 are patterned so as to continuously extend in row directions to serve as selecting gate lines SGD and SGS, respectively.

As described above, during image pickup, the high writing voltage Vpp is applied to the control gate 16 while the selecting gate transistors ST1 and ST2 are turned off, so that the substrate surface potential of the memory transistor MT rises to over ten V. At this time, in order to prevent the surface break-down from occurring in the channel regions of the selecting gate transistors ST1 and ST2, the gate oxide films 13a of the selecting gate transistors ST1 and ST2 must be thicker than the tunnel insulating film 13 of the memory transistor. In addition, it is required to prevent the punch through from occurring in the selecting gate transistors ST1 and ST2 on the same conditions. Therefore, the channel length of the selecting gate transistors ST1 and ST2 is preferably greater than that of the memory transistor MT.

On the substrate having the arrangement of the pixel units 1 formed thereon, signal output lines (DL) 23 formed by patterning a metal film, such as an Al film, are provided via an interlayer dielectric film 22. The signal out put lines 23 contact the drain diffusion layers 18 of the selecting gate transistors ST1 opposite to the memory transistors MT to be arranged so as to continuously extend from the pixel units 1 which extend in column directions. However, as shown in FIG. 5, the signal output lines 23 are provided above the regions of the element isolating insulator films 21 so as not to prevent the pixel units 1 from being irradiated with light. The source-side diffusion layers 18 of the other selecting gate transistors ST of the pixel units 1 opposite to the memory transistors MT are formed so as to continuously extend in row directions in the figure, and a common source line SL commonly for all of the pixel units 1 is connected thereto.

Moreover, on the substrate having the signal output lines 23 formed thereon, shading films 25 are formed via an interlayer dielectric film 24. The shading films 25 are provided for preventing useless light from being incident on regions other than the pixel units 1. The shading films 25 are patterned so as to have openings 26 serving as light incident windows in the regions of the pixel units 1 as shown by the broken lines in FIG. 5. In order to pick up color images, color filters 28 are formed on the substrate having the shading films 25 via an interlayer dielectric film 27. Moreover, on the surfaces of the color filters 28, on-wafer micro lenses 29 are formed for condensing light on the regions of the pixel units 1 from the top.

Figure 8:
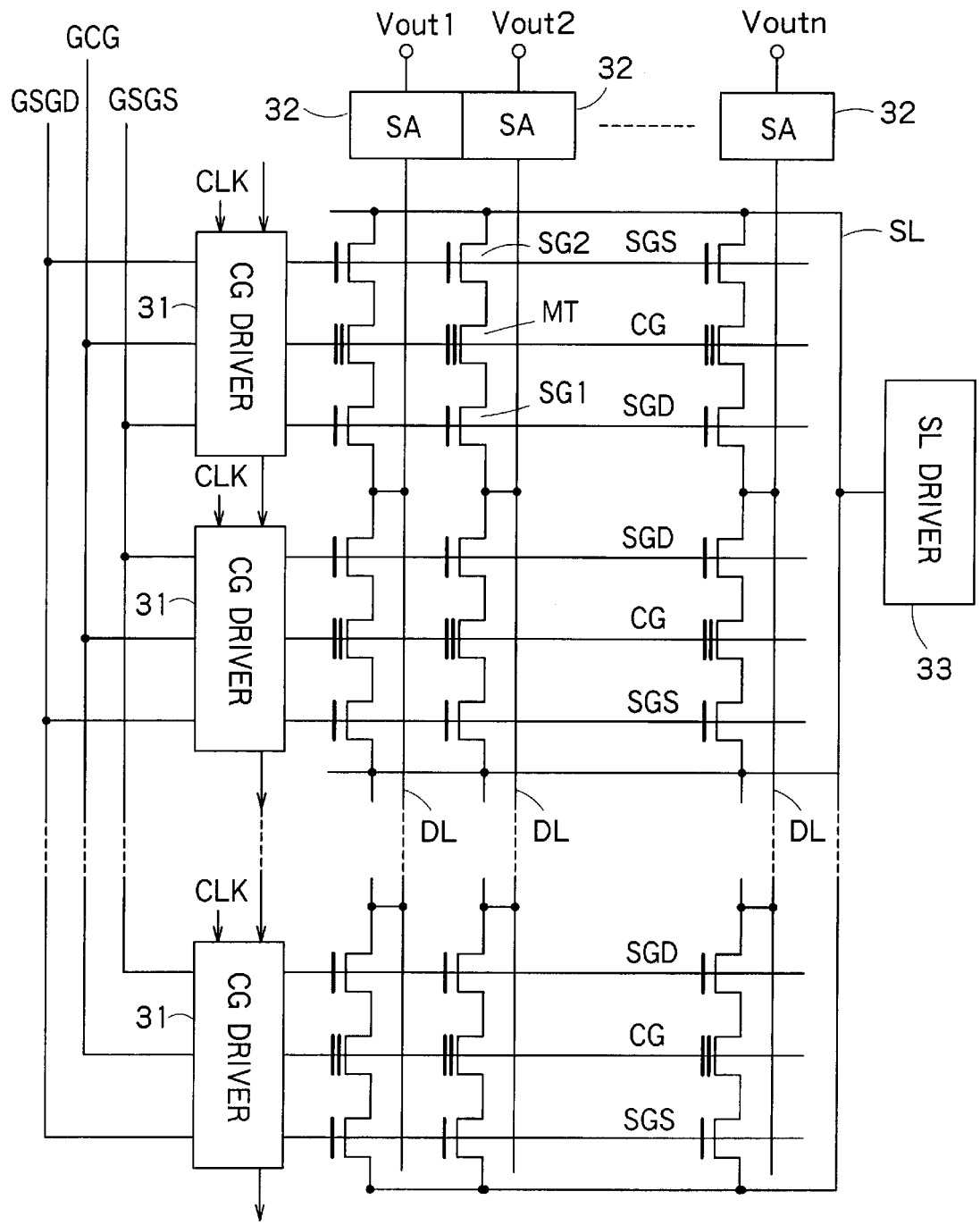
FIG. 8 is an equivalent circuit diagram of the image sensor.

FIG. 8 shows an equivalent circuit of the two-dimensional image sensor with the above described construction. In the end portions of the control gate line CG and selecting gate lines SGD and SGS of each of the pixel units 1, there is provided a CG driver 31 for supplying a required driving voltage thereto during image pickup and readout. To each of the signal output lines DL, a sense amplifier circuit 32 is connected. To the common source line SL, an SL driver 33 is connected. The driving voltage given to the control gate line CG and the selecting gate lines SGD and SGS is commonly supplied to each of the CG drivers 31 from a driving voltage generating circuit (not shown) including a booster circuit (not shown) via common selecting gate lines GSGD and GSGS. Each of the CG drivers 31 has a shift register function so that it is controlled by a clock CLK to sequentially activated. Thus, the line-sequential scanning driving for sequentially selecting the matrix arranged pixel units 1, line by line, is carried out.

However, the image pickup and erase operations are preferably carried out simultaneously for all of the pixel units. In order to achieve this, there is provided a full-selection function for simultaneously activating all of the CG drivers 31. That is, during image pickup, all of the CG drivers 31 supply the writing voltage Vpp to the control gates CG, and 0 V to the selecting gate lines SGD and SGS. Thus, image pickup and writing are carried out on the whole face of the pixel array to store one frame image data. The readout of the one frame image data is carried out, line by line, by, e.g., the line-sequential scanning using the CG drivers 31. During erase, all of the CG drivers 31 supply 0 V to the control gates CG. And the selecting gate lines SGD and SGS are set to be floating state. An erase voltage is applied to the p-type well 12 and n-type well 11 common to the pixel array from a driving circuit (not shown). Thus, the whole face of the pixel array is erased.

Figure 9A:
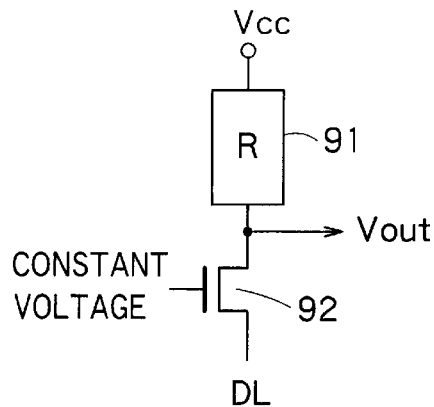
FIGS. 9A and 9B are circuit diagrams showing examples of a sense amplifier circuit for use in the image sensor.
Figure 9B:
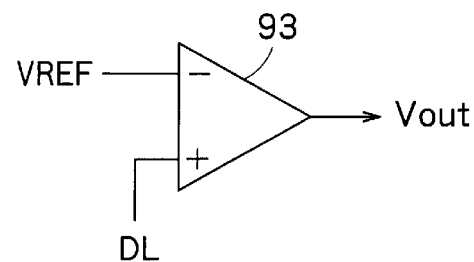

As each of the sense amplifier circuits 32, any one of a current amplification type sense amplifier shown in FIG. 9A and a voltage amplification type sense amplifier shown in FIG. 9B is used. The current amplification type sense amplifier of FIG. 9A comprises a current source load 91 connected to a signal output line DL via a clamping NMOS transistor 92. When this sense amplifier type is used, the SL driver 33 causes the voltage of the common source line SL to be 0 V to carry out readout. The current drawing quantity of the source signal output line DL varies in accordance with the pixel information of the pixel unit 1, and in accordance with this, analog outputs Vout having different levels are obtained.

The sense amplifier of FIG. 9B is a differential amplifier for comparing the output voltage of the signal output line DL with a reference voltage VREF. When this sense amplifier type is used, a voltage Vcc is given to the common source line SL by means of the SL driver 33. Thus, a source follower output voltage is obtained in the signal output line DL by the memory transistor MT of the pixel unit. By amplifying the out put voltage, an analog output Vout for each of the pixels is obtained.

Figure 10:
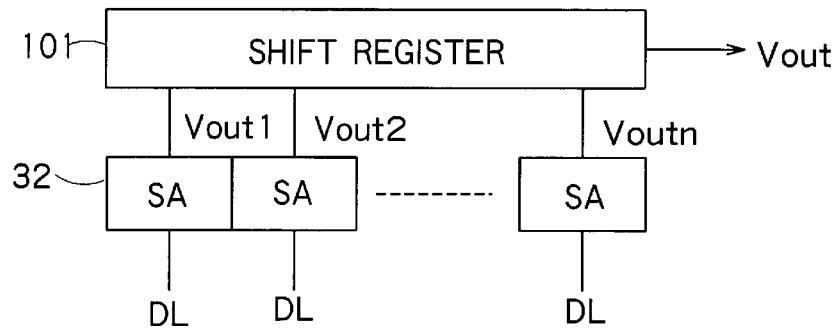
FIG. 10 is a circuit diagram showing an example of a circuit for serially transferring and outputting the outputs of a plurality of sense amplifier circuits.

When the line-sequential scanning readout is carried out by means of the CG driver 31, if each of the signal output lines DL is provided with the sense amplifier circuit 32 as shown in FIG. 8, pixel data corresponding to one line are obtained by these sense amplifier circuits 32 in parallel. When the parallel pixel data are intended to be converted into serial pixel data to be outputted, the output of the sense amplifier circuit 31 may be provided with a shift register 101 as shown in FIG. 10. By carrying out a parallel/serial conversion using the shift register 101, image data for each line can be sequentially converted into serial data to output image data corresponding to one frame.

Figure 11:
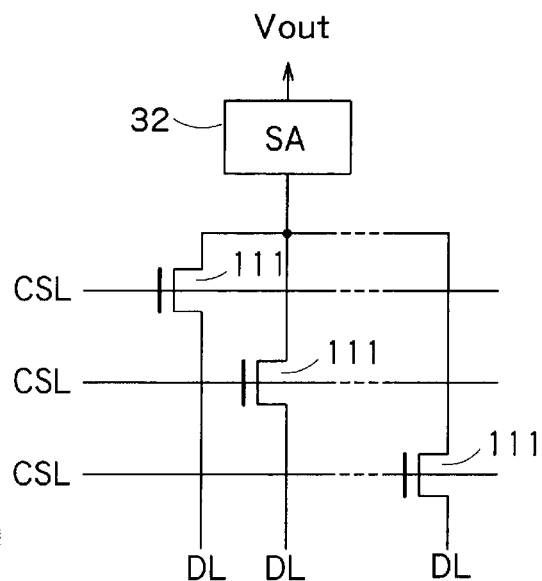
FIG. 11 is a circuit diagram showing an example of a circuit for sequentially selecting one of a plurality of signal output lines for a single sense amplifier circuit.

As a method for serially outputting pixel information, as shown in FIG. 11, one sense amplifier circuit 31 maybe arranged for a plurality of signal output lines DL to select one of the plurality of signal output lines DL by means of select gates 111 which are driven by selection signals CSL. For example, by preparing one sense amplifier circuit 32 for all of the signal output lines DL to sequentially select the signal output lines D1 by selection signals CSL, image data for one line can be outputted as serial data. Alternatively, a plurality of sense amplifier circuits may be provided so that a plurality of signal output lines DL are connected to one sense amplifier circuit 32.

According to this preferred embodiment, each of the pixel units can be formed in a small area similar to pixels used for EEPROM flash memories, so that it is possible to realize an image pickup element having a very high resolution. For example, if a process of 0.4 $\mu$m rule is used, it is possible to realize an image pickup pixel unit having an area of 2.5 $\mu m^2$. This is far smaller than a MOS type image sensor having a pixel area of about 30 $\mu m^2$ which is currently put to practical use. In addition, the electric current consumption of the booster circuit for obtaining a high voltage required during writing and erase predominates in the whole electric current consumption, so that the whole electric current consumption is about 20 mA which is substantially equal to that of a flash memory currently put to practical use. Therefore, the electric power consumption is about 66 mV which is substantially equal to that of a MOS type image sensor currently put to practical use, so that it is possible to realize a nonvolatile image pickup element having a far smaller electric power consumption than that of a CCD type image sensor. In addition, since the variation in quantity of charges due to the irradiation with light is replaced with a tunnel current to be stored, the tunnel current varies exponentially with respect to the variation in quantity of charges. Therefore, it is also characterized in that it is highly sensitive to incident light.

In this preferred embodiment, when it takes a lot of time to start the next image pickup writing operation after erasing pixel information, unnecessary electrons are thermally generated on the channel surface of the memory transistor MT in the erase state to vary the channel potential. For that reason, even if a given voltage is applied to the control gate during subsequent writing, there are some cases where the surface potential of the channel is not the same. Therefore, before the writing operation is started, the selecting gate transistor is set to be in a conducting state, and a positive small voltage is applied to the signal output line DL, so that the thermally generated unnecessary electrons can escape toward the signal output line DL. Thus, the writing operation can be stabilized.

Figure 12:
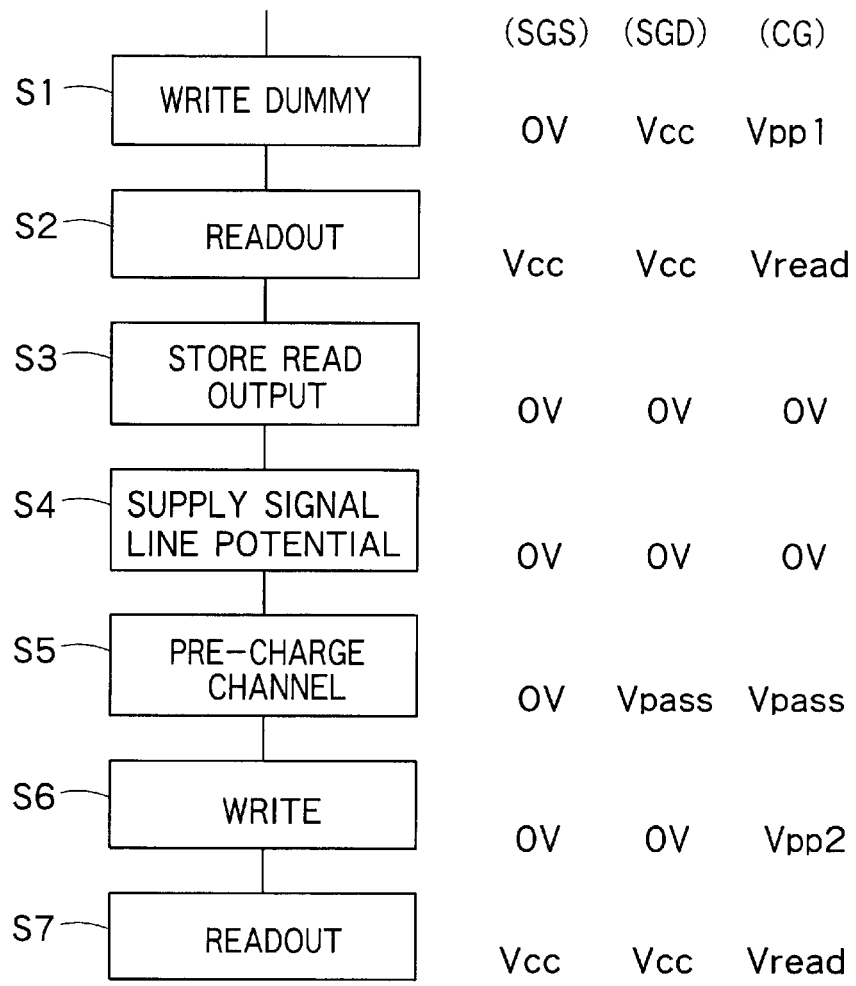
FIG. 12 is a flow chart showing the operation of a preferred embodiment of an image pickup control for writing a dummy.

FIG. 12 shows another preferred embodiment of a method for carrying out an image pickup writing operation. In the above described preferred embodiment, the writing characteristics of each of the memory transistors MT vary every memory transistor. The reason for this is that it is difficult to uniformly produce the tunnel oxide film of the memory transistor MT, so that the thickness and quality of the oxide film vary. Therefore, even if the same electric field is applied to the tunnel oxide film, there are memory transistors having large and small rises in threshold. This variation in threshold of the memory transistor appears as the non-uniformity of brightness of image data during readout, so that the variation is preferably as small as possible.

In this preferred embodiment, a dummy writing operation is preliminarily carried out in order to remove the influence of the above described variation in characteristic of the element. It is assumed that the structure of the image pickup element is the same as that in the preceding preferred embodiment.

First, a writing operation is carried out as a dummy on a weak writing condition (S1). This weak writing operation is carried out by setting 0 V for the signal output line DL and the source-side selecting gate line SGS, a power supply voltage Vcc for the drain-side selecting gate line SGD, and a preliminary writing potential Vpp1 for the control gate line CG. At this time, the voltage of the selecting gate line SGD is Vcc, so that the drain-side selecting gate transistor ST1 is sufficiently turned on. Therefore, electrons are supplied from the signal output line DL to form an inversion layer in the channel region of the memory transistor MT, so that the substrate surface potential is lowest. As a result, a great electric field is produced in the tunnel insulating film between the floating gate and the substrate. This electric field is set so that the threshold of the memory transistor MT approaches 1 V within a predetermined period of time.

Figure 13:
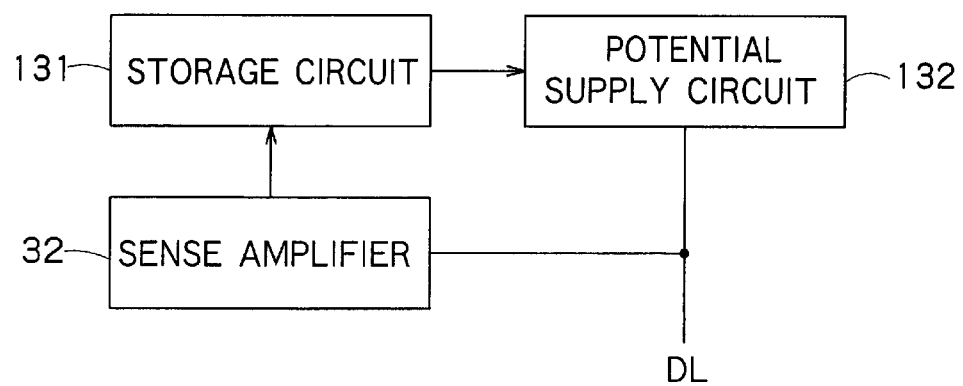
FIG. 13 is a block diagram of a circuit for temporarily storing dummy pixel data in the preferred embodiment.

After this weak writing operation is completed, data of each of the pixel units (i.e., dummy image information) are read out similar to the reading operation in the preceding preferred embodiment (S2). At this time, as shown in FIG. 13, the potential of the pixel information read out by the sense amplifier 32 is written and held in a storage circuit 131 once (S3). As the potential storing circuit 131, there is used a technique for converting an analog signal, which is an output voltage of the sense amplifier circuit 32, into a digital signal once to store the digital signal, or a technique for storing the potential in the form of charges stored in a capacitor.

Then, on the basis of the dummy image information stored in the storage circuit 131, a predetermined voltage is given to the signal output line DL from a potential supply circuit 132. This potential supply circuit 132 is designed to supply a high voltage when the threshold of the memory transistor stored in the potential storing circuit 131 is high, and a low voltage when the threshold of the memory transistor stored in the potential storing circuit is low. After the potential of the signal output line DL is decided, an intermediate pass voltage Vpass, which is lower than the writing voltage Vpp and higher than the power supply voltage Vcc, is applied to the selecting gate line SGD and the control gate line CG. Thus, a positive potential corresponding to the threshold of the memory transistor MT can be transferred from the signal output line DL to the channel portion of the memory transistor MT to pre-charge the channel (S5). That is, the initial potential of the surface of the substrate below the floating gate can be varied in accordance with the threshold of the memory transistor MT. In other words, in a pixel unit having a memory transistor MT having a high writing speed, the initial potential of the surface of the substrate of the memory transistor MT is set to be high. To the contrary, in a pixel unit having a memory transistor MT having a low writing speed, the initial potential of the surface of the substrate of the memory transistor MT is set to be low.

Thereafter, a usual image pickup writing operation is carried out (S6). That is, the Vpass potential of the selecting gate line SGD is lowered to 0 V, and a higher voltage Vpp2 than the writing voltage Vpp1 during weak writing is given to the control gate line CG to raise the substrate surface potential of the memory transistor MT. In this state, the memory transistor MT is irradiated with light. In the memory transistor MT having the high writing speed, the substrate surface potential falls from the higher potential, so that the threshold is difficult to rise. To the contrary, the substrate surface potential of the memory transistor MT having the low writing speed falls from the lower potential, so that the threshold is easy to rise. As a result, pixel information is written while reducing the influence of the variation in the memory transistor MT. Thereafter, a usual reading operation is carried out (S7).

Thus, according to this preferred embodiment, it is possible to reduce the variation in writing characteristic of each of the memory transistors, so that it is possible to reduce the non-uniformity of brightness of image data during readout.

The present invention should not be limited to the above described preferred embodiments. For example, while the stacked gate structure having the floating gate and the control gate has been used as the memory transistor in the above described preferred embodiments, it is possible to use an MNOS type memory transistor which has a gate insulating film structure wherein a tunnel oxide film and a silicon nitride film are stacked, and a control gate formed thereon. In this case, the trap level in the gate insulating film is in a charge storage layer.

In addition, while the two-dimensional image sensor has been described as an example of application in the above described preferred embodiments, the present invention may be applied to a one-dimensional line sensor.

As described above, according to the present invention, it is possible to provide an image sensor system which uses a substrate region below a charge storage layer of a nonvolatile memory transistor as a photoelectric converting region and which comprises image pickup elements with memory function having a small area. In addition, since the present invention does not use any CCDs for reading pixel information, the electric current consumption can be small.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A solid-state imaging device comprising:
   a semiconductor substrate;
   a nonvolatile memory transistor which is formed on the semiconductor substrate and which has a charge storage layer and a control gate, a photoelectric converting region being arranged below the charge storage layers and in the semiconductor substrate, the nonvolatile memory transistor being irradiated with light to generate charges in the photoelectric converting region and to inject the charges into the charge storage layer, the charges being stored in the charge storage layer as pixel information; and
   at least two selecting gate transistors, each of which is formed on both sides of the nonvolatile memory transistor so as to share a diffusion layer with the nonvolatile memory transistor.

2. A solid-state imaging device as set forth in claim 1, which has an image pickup mode, in which the charges generated in the photoelectric converting region are injected into the charge storage layer on the basis of the FN tunneling by turning off the selecting gate transistors and by irradiating the nonvolatile memory transistor with light while a writing voltage is applied to the control gate of the nonvolatile memory transistor, and a reading mode, in which the pixel information is read out by turning on the selecting gate transistors and by applying a reading voltage to the control gate of the nonvolatile memory transistor to detect a conducting state of the nonvolatile memory transistor.

3. A solid-state imaging device as set forth in claim 1, wherein a plurality of pixel units are arranged on the semiconductor substrate in the form of a matrix so as to extend in row and column directions, each of the pixel units comprising the nonvolatile memory transistor and two the selecting gate transistors arranged on both sides thereof.

4. A solid-state imaging device as set forth in claim 3, which further comprises a shading film formed on the semiconductor substrate, the shading film having openings, each of which corresponds to a region of each of the nonvolatile memory transistors.

5. A solid-state imaging device as set forth in claim 3, which further comprises micro lenses, each of which condenses light on a region of each of the nonvolatile memory transistors from the top, the micro lenses being formed on the semiconductor substrate.

6. A solid-state imaging device as set forth in claim 3, which further comprises color filters corresponding to each of the pixel units, the color filters being formed on the semiconductor substrate.

7. A solid-state imaging device as set forth in claim 3, which further comprises:

a shading film formed on the semiconductor substrate, the shading film having openings, each of which corresponds to a region of each of the nonvolatile memory transistors;

color filters corresponding to each of the pixel units; and micro lenses, each of which condenses light on a region of each of the nonvolatile memory transistors from the top through a corresponding one of the color filters.

8. A solid-state imaging device as set forth in claim 3, which further comprises:

driving lines, each of which is connected commonly to the control gate of the nonvolatile memory transistors of the pixel units which are arranged so as to extend in the row directions;

signal output lines, each of which is connected commonly to the diffusion layer of the selecting gate transistors, each of which is arranged on one side of the nonvolatile memory transistors of the pixel units which are arranged so as to extend in the column directions, each of the diffusion layers being opposite to each of the nonvolatile memory transistors; and a common source line connected commonly to the diffusion layer of the selecting gate transistors, each of which is arranged on the other side of the nonvolatile memory transistors of the pixel units which are arranged so as to extend in the column directions, each of the diffusion layers being opposite to each of the nonvolatile memory transistors.

9. A solid-state imaging device as set forth in claim 8, which further comprises current amplification type sense amplifier circuits, each of which is connected to each of the signal output lines.

10. A solid-state imaging device as set forth in claim 9, which further comprises a shift register inputted outputs in parallel from the sense amplifier circuits, and converting them into serial data to output.

11. A solid-state imaging device as set forth in claim 8, which further comprises voltage amplification type sense amplifier circuits, each of which is connected to each of the signal output lines.

12. A solid-state imaging device as set forth in claim 11, which further comprises a shift register inputted outputs in parallel from the sense amplifier circuits, and converting them into serial data to output.

13. A solid-state imaging device as set forth in claim 8, which further comprises a sense amplifier circuit connected commonly to the signal output lines, the sense amplifier circuit being inputted outputs sequentially from the signal output lines to output serial data.

14. A method for controlling a solid-state imaging device comprising:

a semiconductor substrate;

a nonvolatile memory transistor which is formed on the semiconductor substrate and which has a charge storage layer and a control gate, a photoelectric converting region being arranged below the charge storage layers and in the semiconductor substrate, the nonvolatile memory transistor being irradiated with light to generate charges in the photoelectric converting region and to inject the charges into the charge storage layer, the charges being stored in the charge storage layer as pixel information; and at least two selecting gate transistors, each of which is formed on both sides of the nonvolatile memory transistor so as to share a diffusion layer with the nonvolatile memory transistor, wherein a plurality of pixel units are arranged on the semiconductor substrate in the form of a matrix so as to extend in row and column directions, each of the pixel units comprising the nonvolatile memory transistor and two the selecting gate transistors arranged on both sides thereof, the method comprising:

an erase step for electrically emitting charges from the charge storage layer of the nonvolatile memory transistors;

an image pickup step for turning off the selecting gate transistors and irradiating the nonvolatile memory transistors with light while a writing voltage is applied to the control gate of the nonvolatile memory transistors, to inject charges generated in the photoelectric converting region of a corresponding one of the nonvolatile memory transistors, into the charge storage layer of the corresponding one of the nonvolatile memory transistors; and a reading step for reading the pixel information by applying a reading voltage to the control gate of a corresponding one of the nonvolatile memory transistors while the selecting gate transistors are turned on.

15. A method for controlling a solid-state imaging device comprising:

a semiconductor substrate;

a nonvolatile memory transistor which is formed on the semiconductor substrate and which has a charge storage layer and a control gate, a photoelectric converting region being arranged below the charge storage layers and in the semiconductor substrate, the nonvolatile memory transistor being irradiated with light to generate charges in the photoelectric converting region and to inject the charges into the charge storage layer, the charges being stored in the charge storage layer as pixel information; and at least two selecting gate transistors, each of which is formed on both sides of the nonvolatile memory transistor so as to share a diffusion layer with the nonvolatile memory transistor, wherein a plurality of pixel units are arranged on the semiconductor substrate in the form of a matrix so as to extend in row and column directions, each of the pixel units comprising the nonvolatile memory transistor and two the selecting gate transistors arranged on both sides thereof, the method comprising:

an erase step for electrically emitting charges from the charge storage layer of the nonvolatile memory transistors;

a pre-writing step for turning off the selecting gate transistors and applying a first writing voltage to the control gates of the nonvolatile memory transistors, to inject charges, which exist in an inversion layer formed in a channel region of a corresponding one of the nonvolatile memory transistors, into the charge storage layer of the corresponding one of the nonvolatile memory transistors, the charges being stored in each of the charge storage layers as dummy pixel information; and a pre-reading step for reading and storing the dummy pixel information by applying a reading voltage to the control gate of each of the nonvolatile memory transistors while each of the selecting gate transistors are turned on;

a pre-charging step for pre-charging a channel region of each of the nonvolatile memory transistors on the basis of the dummy pixel information;

an image pickup step for turning off the selecting gate transistors and irradiating the nonvolatile memory transistors with light while a second writing voltage is applied to the control gate of the nonvolatile memory transistors, to inject charges generated in the photoelectric converting region of a corresponding one of the nonvolatile memory transistors, into the charge storage layer of the corresponding one of the nonvolatile memory transistors, the charges being stored in the charge storage layer as the pixel information; and a reading step for reading the pixel information by applying a reading voltage to the control gate of a corresponding one of the nonvolatile memory transistors while each of the selecting gate transistors are turned on.

* * * * *